United States Patent
Kanaya

(10) Patent No.: US 7,821,049 B2
(45) Date of Patent: Oct. 26, 2010

(54) SEMICONDUCTOR MEMORY DEVICE AND METHOD FOR FABRICATING SEMICONDUCTOR MEMORY DEVICE

(75) Inventor: Hiroyuki Kanaya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 12/038,226

(22) Filed: Feb. 27, 2008

(65) Prior Publication Data

US 2008/0217669 A1 Sep. 11, 2008

(30) Foreign Application Priority Data

Mar. 6, 2007 (JP) ............................. 2007-056403

(51) Int. Cl.
*H01L 27/105* (2006.01)
(52) U.S. Cl. ............... 257/296; 257/295; 257/E21.645; 438/3
(58) Field of Classification Search ............... 257/295, 257/296, E21.645, E21.001, E27.081; 438/3, 438/239
See application file for complete search history.

(56) References Cited

U.S. PATENT DOCUMENTS

| | | | | |
|---|---|---|---|---|
| 5,903,492 | A | * | 5/1999 | Takashima ............... 365/145 |
| 6,603,161 | B2 | | 8/2003 | Kanaya et al. |
| 6,768,151 | B2 | * | 7/2004 | Kasai ..................... 257/295 |
| 6,800,890 | B1 | * | 10/2004 | Wohlfahrt et al. ......... 257/295 |
| 7,022,531 | B2 | | 4/2006 | Ozaki et al. |
| 2002/0033494 | A1 | * | 3/2002 | Ozaki et al. ............. 257/295 |
| 2005/0118795 | A1 | | 6/2005 | Hidaka et al. |

* cited by examiner

*Primary Examiner*—Thinh T Nguyen
(74) *Attorney, Agent, or Firm*—Oblon, Spivak, McClelland, Maier & Neustadt, L.L.P.

(57) ABSTRACT

According to an aspect of the present invention, there is provided a semiconductor memory device comprising, a first transistor and a second transistor formed on a semiconductor substrate, a memory capacitor formed above the first transistor, the memory capacitor being connected to the first transistor, a dummy memory capacitor formed above the second transistor, a wiring layer formed above the memory capacitor and the dummy memory capacitor, the wiring layer being connected to the first transistor and the memory capacitor, a first plug connecting between the second transistor and the dummy memory capacitor, and a second plug connecting between the dummy memory capacitor and the wiring layer.

5 Claims, 6 Drawing Sheets

SEMICONDUCTOR MEMORY DEVICE AND METHOD FOR FABRICATING SEMICONDUCTOR MEMORY DEVICE

CROSS REFERENCE TO RELATED APPLICATION

This application is based upon and claims the benefit of priority from the prior Japanese Patent Application No. JP2007-056403, filed Mar. 6, 2007; the entire contents of which are incorporated herein by reference.

FIELD OF THE INVENTION

The present invention relates to a semiconductor memory device including a ferroelectric capacitor as a memory cell.

DESCRIPTION OF THE BACKGROUND

Ferroelectric memories have been developed as one kind of non-volatile semiconductor memory devices having high reliability and low consumption current. Among the ferroelectric memories, one ferroelectric memory having a memory block cell has been noticed from a view point as high integration, and the ferroelectric memory is disclosed in Japanese Patent Publication (Kokai) No. H10-255483, Japanese Patent Publication (Kokai) No. H11-177036 and Japanese Patent Publication (Kokai) No. 2001-257320, for example. In the ferroelectric memory, a memory block cell includes a plurality of memory cells serially connected each other, both ends of a ferroelectric capacitor being connected between a source and a drain of a transistor in each of the memory cells.

On the other hand, micro loading effect in miniaturization processes produces a problem accompanying recent progress of fabricating method for a semiconductor device. The micro loading effect is caused at an area having different and non-periodic sizes of element-patterns in the semiconductor device as comparing with another area in the semiconductor. In the area, a mask material such as a resist is etched over to shrink the mask shape. Therefore, when a memory capacitor is etched in conventional semiconductor memory devices, a problem with difficulty to obtain a desirable etching shape is produced in an end of a memory cell block as comparing with the inner portion of the memory cell block where the memory cells are configured at an equal interval.

To overcome the problem mentioned above, a method to configure a dummy ferroelectric capacitor in a block selector portion disposed between memory cell blocks is proposed in Japanese Patent Publication (Kokai) No. 2002-94022, for example.

However, the block selector portion includes a bit line contact with a high aspect ratio, the bit line contact connecting between a block-selection transistor disposed at one end of the memory block and a bit line formed at an upper portion of the memory capacitor. Accordingly, the dummy capacitor for improving the micro loading effect is disposed in avoiding the bit line contact intentionally. As the bit line contact is configured in the block selector portion in the conventional semiconductor memory device, a problem with a limitation is produced. In the problem, the dummy capacitor cannot necessarily be configured effectively for the micro loading effect. Further, priority for improvement of the micro loading effect causes a problem which the area of the block selector portion is increased beyond necessity.

Moreover, the high aspect ratio of the bit line contact causes a difficult problem for connecting in the contact. Further, hydrogen diffusion to a transistor or the like in a process including hydrogen such as forming a tungsten plug or the like is also a problem.

SUMMARY OF THE INVENTION

According to an aspect of the invention, there is provided, a semiconductor memory device comprising, a first transistor and a second transistor formed on a semiconductor substrate, a memory capacitor formed above the first transistor, the memory capacitor being connected to the first transistor, a dummy memory capacitor formed above the second transistor, a wiring layer formed above the memory capacitor and the dummy memory capacitor, the wiring layer being connected to the first transistor and the memory capacitor, a first plug connecting between the second transistor and the dummy memory capacitor, and a second plug connecting between the dummy memory capacitor and the wiring layer.

Further, another aspect of the invention, there is provided, a semiconductor memory device comprising, a memory cell block formed on a semiconductor substrate, the memory cell block being constituted with a plurality of memory cells, each of the memory cells being constituted with a first MIS transistor and a memory capacitor, the plurality of the first MIS transistors being formed on the semiconductor substrate, the plurality of the memory capacitors being formed above the first MIS transistor, each of the memory capacitors being connected to each of the first MIS transistors, respectively, a block selector portion formed on the semiconductor substrate, the block selector portion being constituted with a second MIS transistor and a dummy memory capacitor, the second MIS transistor being formed on the semiconductor substrate, a source or a drain of the second MIS transistor being connected to a source or a drain of the first MIS transistor, the dummy memory capacitor being connected to the second MIS transistor, a wiring layer being formed above the memory capacitor and the dummy memory capacitor, a first plug connecting between the second MIS transistor and the dummy memory capacitor, a second plug connecting between the dummy memory capacitor and the wiring layer.

Further, another aspect of the invention, there is provided, a method for fabricating a semiconductor memory device comprising, forming a transistor on a semiconductor substrate, forming a first inter-layer insulator over the transistor, forming a first plug in the first inter-layer insulator to connect between the first plug and a source-drain of the transistor, forming a first electrode film, a dielectric film and a second electrode film in order over the first plug and the first inter-layer insulator, etching the second electrode film, the dielectric film and the first electrode film in order after forming a first mask on the second electrode film so as to form a memory capacitor and a dummy memory capacitor, the memory capacitor including an upper electrode, an dielectric film and a lower electrode and the dummy memory capacitor including a dummy upper electrode, a dummy dielectric film and a dummy lower electrode, forming a second inter-layer insulator over the memory capacitor and the dummy memory capacitor, forming a second plug in the second inter-layer insulator to connect between the second plug and the upper electrode of the memory capacitor and the dummy lower electrode of the dummy memory capacitor, and forming an wiring layer on the second inter-layer insulator and the second plug.

DETAILED DESCRIPTION OF THE INVENTION

Figure 1:
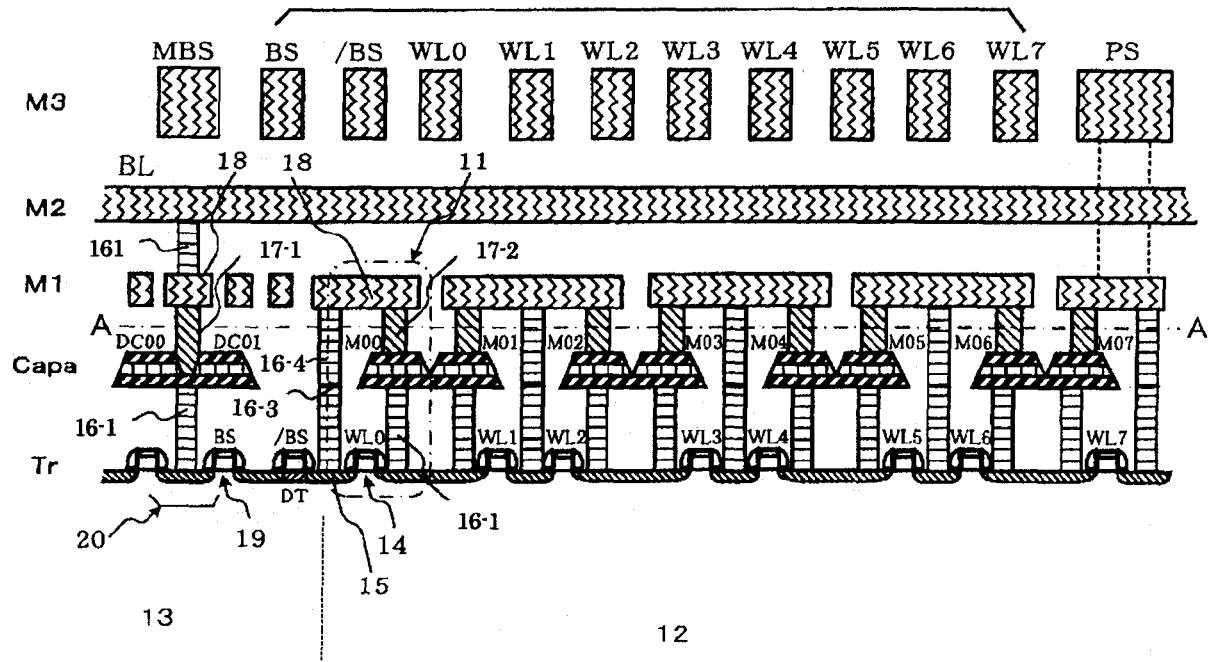
FIG. 1 is a schematic cross-section view showing a structure of a nonvolatile semiconductor memory device in an embodiment of the present invention.

Embodiments of the present invention will be described below in detail with reference to the drawing mentioned above.

First Embodiment

FIG. 1 is a schematic cross-section view showing a structure of a nonvolatile semiconductor memory device in an embodiment of the present invention. In the FIG. 1, a chain unit having a memory block 12 and a block selector portion 13, the memory block 12 including eight memory cells 11 being serially connected each other are demonstrated as an example. Hatchings in a semiconductor substrate and an inter-layer insulator are omitted for avoiding complication in the figure. Further, the dashed-dotted A-A in FIG. 1 is demonstrated a position of FIG. 2 in the plan view.

The nonvolatile semiconductor memory device according to the embodiment of the present invention includes the memory block 12 having the eight memory cells 11 being serially connected, a bit line being called as the BL being formed along a longitudinal direction (horizontal direction in the page of FIG. 1.) of the memory block 12 over the memory block 12, and the block selector portion 13 selecting the memory block 12 and electrically connecting to the BL.

One end of the memory block 12 is connected to the block selector portion 13 via a diffusion layer 15 of a switching transistor 14, the switching transistor 14 being called as the switching Tr 14. The other end of the memory block 12 is connected to a plate wiring being called as the PL of an M3-layer via an M1-wiring 18 and a via-contact.

In convenience, a portion in which a transistor is formed over a surface of the semiconductor substrate is called a Tr-layer. A portion in which a ferroelectric capacitor is formed over the Tr-layer is called as a Capa-layer. A first wiring layer formed over the Capa-layer is called as an M1-layer. A second wiring layer in which the BL is formed over the M1-layer is called as an M2-layer. A third wiring layer in which a stitch wiring or the like is formed over the M2-layer is called as the M3-layer.

The memory cell 11 includes the switching Tr 14 formed in the Tr-layer and one of cell capacitors M00-M07 constituted with ferroelectric capacitors formed in the Capa-layer, respectively. Both ends of the cell capacitor M00, for example, are connected between a source and a drain of the switching Tr 14, respectively.

One of the diffusion layers 15 in the switching Tr 14 is connected to a lower electrode of the cell capacitor M00, for example, via a first tungsten plug 16-1 being called as the first W-plug 16-1, and the other of the diffusion layers 15 in the switching Tr 14 is connected to an upper electrode of the cell capacitor M00 via first tungsten plugs 16-3, 16-4 and further connected to the M1-wiring 18 via an aluminum plug 17-2 being called as the Al-plug 17-2.

A gate of the switching Tr 14 is connected to one of word lines WL0-WL7, respectively. The word lines WL0-WL7 are shunted by the M3-wirings, respectively, to lower the resistance as the word line.

The block selector portion 13 includes a selection transistor 19 formed in the Tr layer, the selection transistor 19 being called as the selection Tr 19, a dummy transistor DT and a bit line contact 20 being called the BL contact 20 connecting between the selection Tr 19 and the BL.

One of the diffusion layers 15 of the dummy transistor DT is commonly formed with one of the diffusion layers 15 in the switching Tr 14, and the other of the diffusion layers 15 of the dummy transistor DT is commonly formed with one of the diffusion layers 15 in the selection Tr 19. The selection Tr 19 and the gate of the dummy transistor DT are connected to a pair of block selection lines BS and /BS, respectively. Here, the /BS means the /BS signal is complimentary with the BS signal.

A channel region of the dummy transistor DT is implanted with a suitable impurity to lower a threshold voltage. Consequently, the dummy transistor DT retains the on-state when the gate voltage is negative so that the dummy transistor DT equivalently acts as the same as a diffusion layer wiring. The structure of the dummy transistor DT is introduced to form a folded bit line constitution, for example, disclosed in Japanese Patent Publication (Kokai) No. H11-177036 in detail.

As shown in FIG. 1, the BL contact 20 includes two dummy capacitors DC00, DC01 constituted with the ferroelectric capacitor, the first W-plug 16-1, a second W-plug 161 being called as the second W-plug 161, an Al-plug 17-1, and the M1 wiring 18 being formed in the M1-layer in isolate.

The two dummy capacitors DC00, DC01 have the same structure as the cell capacitors M00-M07, respectively, and formed in the Capa layer. The structure and a fabricating method of the ferroelectric capacitor are demonstrated later by using FIG. 6.

The lower electrode of the cell capacitors DC00, DC01 is connected to the diffusion layer 15 of the selection Tr 19 via the first W-plug 16-1, the lower electrode of the cell capacitors DC00, DC01 is connected to the isolated M1 wiring 18 via the Al-plug 17-1, and the isolated M1 wiring 18 is connected to the BL via the second W-plug 161.

Here, an important matter in this embodiment is that each of the upper electrodes is connected to the Al-plug 17-2 in the cell capacitors M00-M07, however, the Al-plug 17-1 in the dummy capacitors DC00, DC01 is embedded between the two upper electrodes and ferroelectric films to be connected to the lower electrode. In other words, the upper electrode, the ferroelectric film and the lower electrode in the dummy capacitor are the dummy upper electrode, the dummy ferroelectric film and the dummy lower electrode, respectively, and the dummy lower electrode has connection function to the upper and lower layers. According to constituting the structure of the dummy capacitor, the Al-plug 17-2 in the memory block 12 and the Al-plug 17-1 in the block selector portion 13 are simultaneously formed in a same fabricating process. The fabricating process of the ferroelectric capacitor is demonstrated later by using FIG. 4 and FIG. 5.

Figure 2:
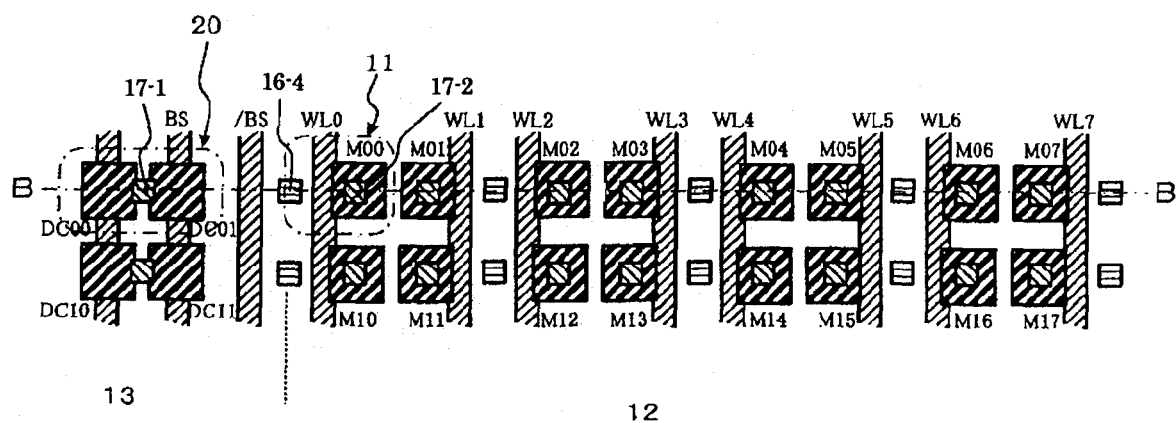
FIG. 2 is a schematic plane view showing the structure of the nonvolatile semiconductor memory device in the embodiment of the present invention.

FIG. 2 is a schematic plane view showing a chain unit structure of the nonvolatile semiconductor memory device in the embodiment of the present invention. Here, the memory block 12 and the block selector portion 13 corresponding to FIG. 1 are demonstrated as to the pair of the bit lines BL and /BL. For simplifying the figure, a hatching in the inter-layer insulator is omitted to demonstrate the cell capacitors M00-M07 under the inter-layer insulator, the upper electrodes of the dummy capacitors DC00, DC01, the word lines WL0-WL7 and the block selection lines BS, /BS. Furthermore, the dashed-dotted B-B in FIG. 2 is demonstrated a cross-section position of FIG. 1.

In the nonvolatile semiconductor memory device of the embodiment of the present invention, the chain units having the dummy capacitors DC00, DC01 and the cell capacitors M00-M07 disposed along the bit line direction being the horizontal direction in the page of FIG. 2 are repeatedly disposed along the word line direction being the vertical direction in the page of FIG. 2.

As shown in FIG. 2, each of the Al-plugs 17-2 in the memory block 12 is connected to nearly the center in each of the upper electrodes in the cell capacitors M00-M07, respectively, and W-plugs 16-4 are disposed both sides of pairs of the cell capacitors M00-M07, namely, a pair of the cell capacitor M00 and the cell capacitor M01, a pair of the cell capacitor M02 and the cell capacitor M03, a pair of the cell capacitor M04 and the cell capacitor M05, and a pair of the cell capacitor M06 and the cell capacitor M07, respectively.

On the other hand, the Al-plug 17-1 in the block selector portion is embedded between the two upper electrodes of the dummy capacitor DC00, DC01 to be connected to the lower electrode.

Figure 3:
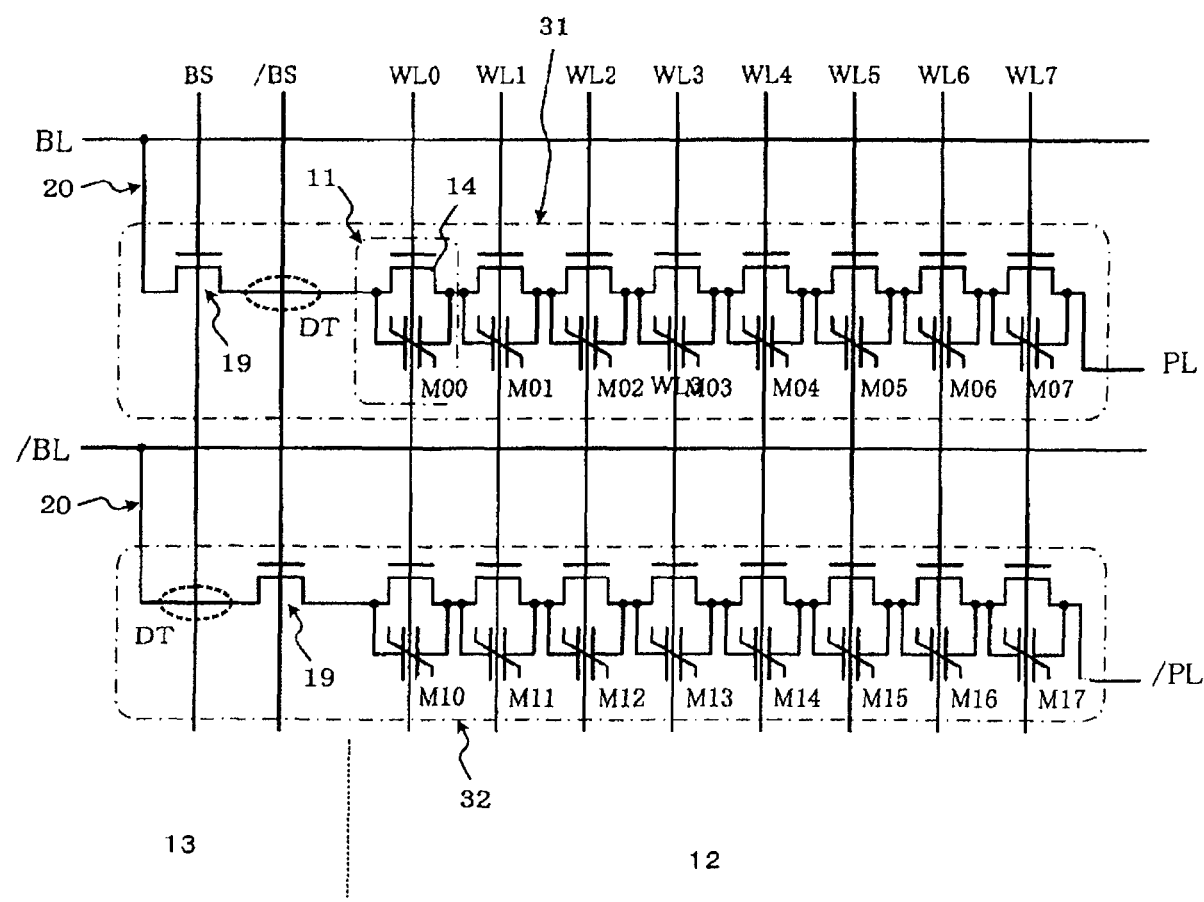
FIG. 3 is a circuit diagram showing the nonvolatile semiconductor memory device in the embodiment of the present invention.

FIG. 3 is a circuit diagram showing the nonvolatile semiconductor memory device in the embodiment of the present invention. Here, the chain unit corresponding to FIG. 1 and FIG. 2 are demonstrated on a couple of the bit line pair BL, /BL. Further, in FIG. 3, a portion of a corresponding composition to FIG. 1 and FIG. 2 is attached the same number. Therefore, explanation on the same number in FIG. 3 of the embodiment is omitted.

The nonvolatile semiconductor memory device in the embodiment of the present invention includes the pair of BL and /BL and two chain units 31, 32, one end of the two chain units 31, 32, respectively, being connected to the BL and /BL to constitute the folded bit line.

The chain units 31 and 32, respectively, includes the memory block 12 having the eight memory cells 11 and the block selector portion 13 having the selection Tr 19, the dummy transistor DT and the BL contact 20.

One end of the chain unit 31 is connected to the BL via the BL contact 20 and the other end of the chain unit 31 is connected to the PL. One end of the chain unit 32 is connected to the /BL via the BL contact 20 and the other end of the chain unit 32 is connected to the /PL. The /PL has a complimentary relation with the PL.

The eight memory cells 11 having the switching Tr 14 and each of the cell capacitors M00-M07 connected in parallel each other are serially connected each other in the memory block 12 of the chain unit 31, respectively. The gate of each switching Tr 14 is connected to the WL0-WL7, respectively.

A drain of the selection Tr 19 is connected to one end of the memory block 12 via the dummy transistor DT in the block selector portion 13 of the chain unit 31. A source of the selection Tr 19 is connected to the BL via the BL contact 20. A gate of the selection Tr 19 is connected to the block selection line BS.

The structure of the chain unit 32 is the same as the structure of the chain unit 31 except connection of the block selector portion 13. Namely, the drain of the selection Tr 19 is directly connected to the one end of the memory block 12, the source of the selection Tr 19 is connected to /BL via the BL contact 20 and the dummy transistor DT, and the gate of the selection Tr 19 is connected to the block selection line /BS in the chain unit 32, respectively. The folded bit line constitution is accomplished by constituting the structure mentioned above.

Next, a fabricating process of the semiconductor memory device with the structure mentioned above is explained. FIGS. 4A-4C and FIGS. 5A-5C are schematic cross-section views showing a method for fabricating the nonvolatile semiconductor memory device in the embodiment of the present invention. Here, mainly the block selector portion 13 and a portion of the memory block 12 adjacent to the block selector portion 13 are demonstrated. Further, as same as FIG. 1, hatchings of the semiconductor substrate and the inter-layer insulator are omitted.

The method for fabricating the nonvolatile semiconductor memory device in the embodiment of the present invention is constituted with forming the switching Tr 14, the selection Tr 19 and the dummy transistor DT in the Tr-layer (ST1), forming the ferroelectric capacitor in the Capa-layer (ST2), forming the Al-plugs 17-1, 17-2 over the upper portion of the ferroelectric capacitor (ST3), forming the M1 wiring 18 in the M1-layer over the upper portion of the Al-plugs 17-1, 17-2 (ST4) and forming the BL in the M2-layer after forming a necessary contact (ST5).

In ST1, the switching Tr 14, the selection Tr 19 and the dummy transistor DT are formed on the semiconductor substrate surface, the first inter-layer insulator is entirely deposited in plane, and a surface of the first inter-layer insulator is planarized by CMP technique. After the planarization, the first W-plug 16-1 connecting between the lower electrode of the ferroelectric capacitor and the diffusion layer 15, and the first W-plug 16-3 connecting between the M1 wiring 18 being formed in ST4 as described later in [0045] and the diffusion layer 15 are respectively formed.

In ST2, the lower electrode film BE, the ferroelectric film FE and the upper electrode film TE constituting the ferroelectric capacitor are deposited in order as shown in FIG. 4A, for example, TiAlN(30 nm)/Ir(120 nm) of a barrier metal as the lower electrode BE, $Pb(Zr_xTi_{1-x})O_3$ (100 nm) as the ferroelectric film FE and $SrRuO_3$(10 nm)/$IrO_2$ (70 nm) as the upper electrode TE.

Next, a mask 41 is patterned to form the ferroelectric capacitor as shown in FIG. 4B. Here, a hard mask, for example, $Al_2O_3/SiO_2$ of a stacked layer, $TiAlN/Al_2O_3/SiO_2$ of a stacked layer or the like is used as the mask 41.

The hard mask 41 is composed of at least one of a silicon oxide film (a $SiO_x$ film: for example a $SiO_2$ film), an aluminum oxide film (an $Al_xO_y$ film, for example an $Al_2O_3$ film), a silicon aluminum oxide film (a $SiAl_xO_y$ film, for example a SiAlO film), a zirconium oxide film (a $ZrO_x$ film, for example a $ZrO_2$ film), a siliconnitride film (a $Si_xN_y$ film, for example a $Si_3N_4$ film), a titanium aluminum nitride (a $TiAl_xN_y$ film (x=1%-99%), for example a $TiAl_{0.5}N_{0.5}$ film) or a stacked layer combined with the films mentioned above.

The mask 41 is not necessary to use the hard mask, hence, a photo-resist may be used as a suitable case.

Figure 4:
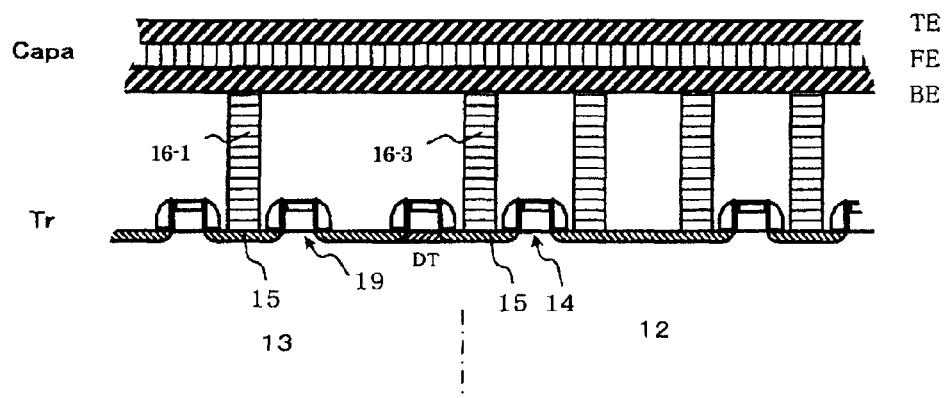
FIGS. 4A, 4B and 4C are schematic cross-section views showing a method for fabricating the nonvolatile semiconductor memory device in the embodiment of the present invention.
Figure 4:
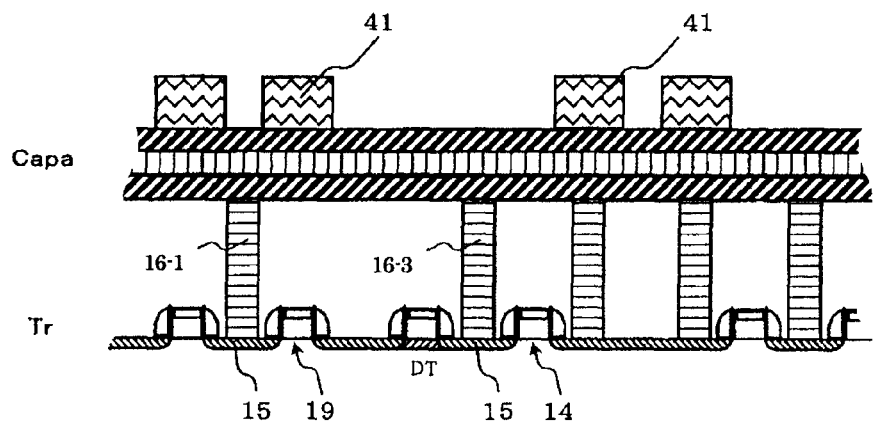
Figure 4:
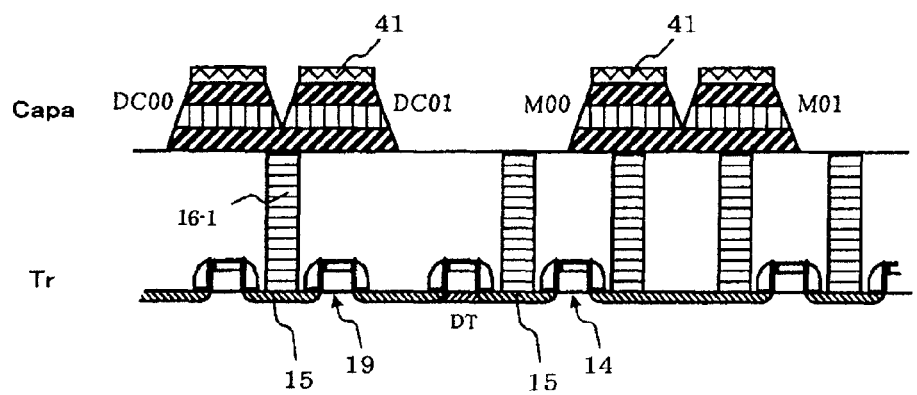
Figure 5:
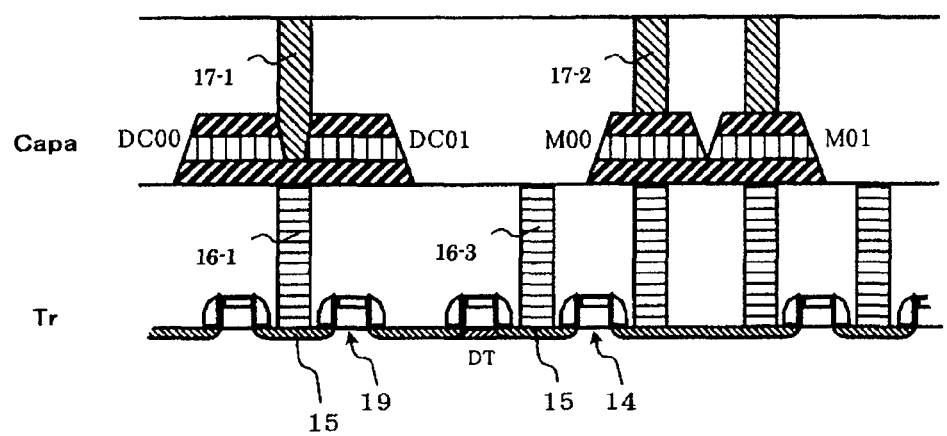
FIGS. 5A, 5B and 5C are schematic cross-section views showing the method for fabricating the nonvolatile semiconductor memory device in the embodiment of the present invention.
Figure 5:
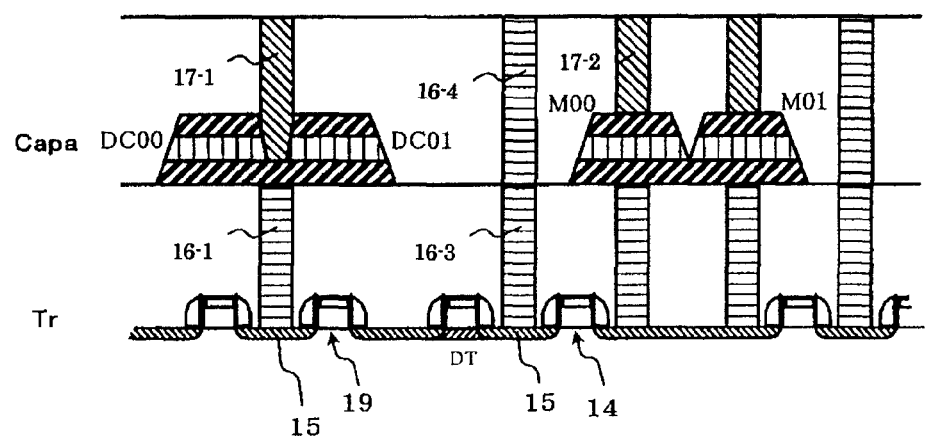
Figure 5:
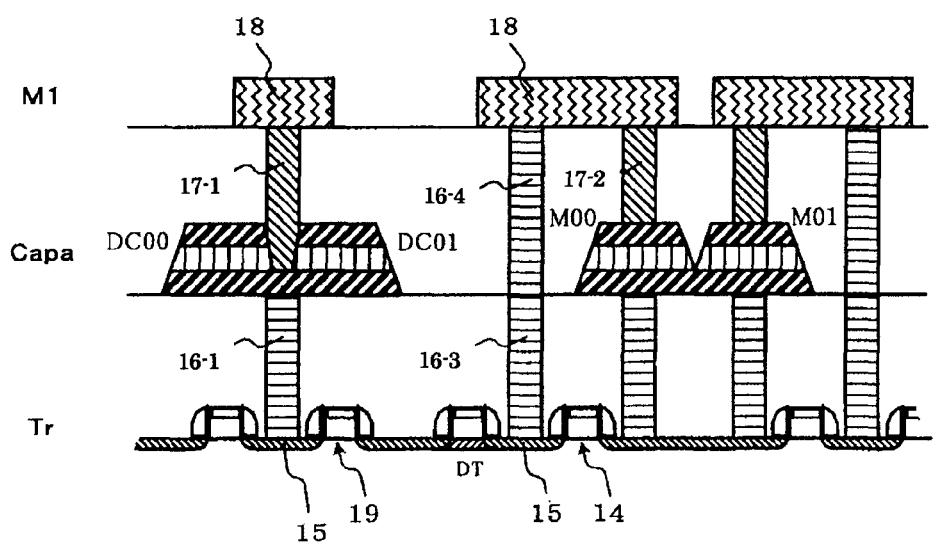

Next, as shown in FIG. 4C, the cell capacitors M00-M07 and the dummy capacitor DC00, DC01 are etched by using RIE. When high temperature RIE being more than 200° C. is used, the hard mask is available as the mask 41. After etching by RIE, the mask 41 may be remained or not. In FIG. 5, a case shows where the mask 41 is eliminated. On the other hand, another case where the mask 41 being remained is demonstrated in FIG. 7 as described later in [0053].

In ST3, a hydrogen passivation film (not illustrated) and a second inter-layer insulator are deposited and are planarized by CMP technique. The Al-plugs 17-2, 17-1 onto the upper electrodes of the ferroelectric capacitors M00-M07 and the lower electrode of the dummy capacitors DC00, DC01, respectively, are simultaneously formed as shown in FIG. 5A.

Here, the hydrogen passivation film is composed of at least one of a silicon oxide film (a $SiO_x$ film, for example a $SiO_2$ film), an aluminum oxide film (an $Al_xO_y$ film, for example an $Al_2O_3$ film), a silicon aluminum oxide film (a $SiAl_xO_y$ film, for example a SiAlO film), a zirconium oxide film (a $ZrO_x$ film, for example a $ZrO_2$ film), a silicon nitride film (a $Si_xN_y$ film, for example a $Si_3N_4$ film) or a stacked layer combined with the films mentioned above.

In ST4, an upper portion of the first W-plug 16-4 is formed on the lower portion of the first W-plug 16-3 in the both side of the paired cell capacitors formed in ST1 as shown in FIG. 5B. Here, processing steps where the upper portion of the first W-plug 16-4 is formed prior to forming the Al-plugs 17-1, 17-2 in ST3 can be used.

Next, the M1 wirings 18 connecting between the upper electrode of the cell capacitors M00-M07 and the diffusion layer 15 of the switching Tr 14 and the isolated M1 wiring 18 connecting between the lower electrode of the dummy capacitors DC00, DC01 and the BL are formed as shown in FIG. 5C.

In ST5, a third inter-layer insulator is deposited and is planarized by CMP technique, subsequently the BL is formed in the M2 layer. Furthermore, the wirings, such as the PL, the stitch wiring or the like are formed in the M3-layer by using the same processing steps as described above to complete the structure as shown in FIG. 1.

Figure 6:
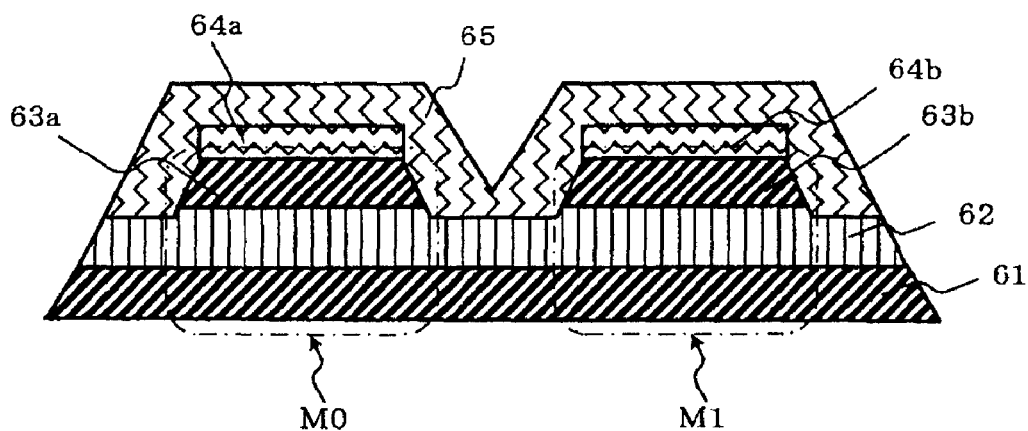
FIG. 6 is a schematic cross-section view showing a structure of a ferroelectric capacitor in the nonvolatile semiconductor memory device in a modification of the embodiment of the present invention.

FIG. 6 is a schematic cross-section view showing a structure of a ferroelectric capacitor in a nonvolatile semiconductor memory device in a modification of the embodiment of the present invention. Here, the structure being formed by using two kinds of masks is demonstrated as a case with the remained masks.

The ferroelectric capacitor in the nonvolatile semiconductor memory device in the modification is composed of the paired two cell capacitors M0, M1. Two upper electrodes 63a, 63b are formed over a common lower electrode 61 via a ferroelectric film 62.

First masks 64a, 64b are formed on the upper electrodes 63a, 63b, respectively, and a second mask 65 is formed to cover the masks 64a, 64b and upper electrodes 63a, 63b.

The structure of the ferroelectric capacitor mentioned above is obtained by a fabricating method as described below. As shown in FIG. 5B, the first masks 64a, 64b are formed on the upper electrode film TE. Subsequently, the upper electrode film TE and a part of the ferroelectric film FE are etched to form the two upper electrodes 63a, 63b.

Next, the second mask 65 is formed to cover the first masks 64a, 64b and the upper electrodes 63a, 63b. The residual ferroelectric film FE and the bottom electrode film BE are etched to form the common lower electrode 61 by using the second mask 65. As shown in FIG. 4 and FIG. 5, the cell capacitors M00-M07 in the memory block 12 and the dummy capacitors DC00, DC01 in the block selector portion 13 are simultaneously formed.

Figure 7:
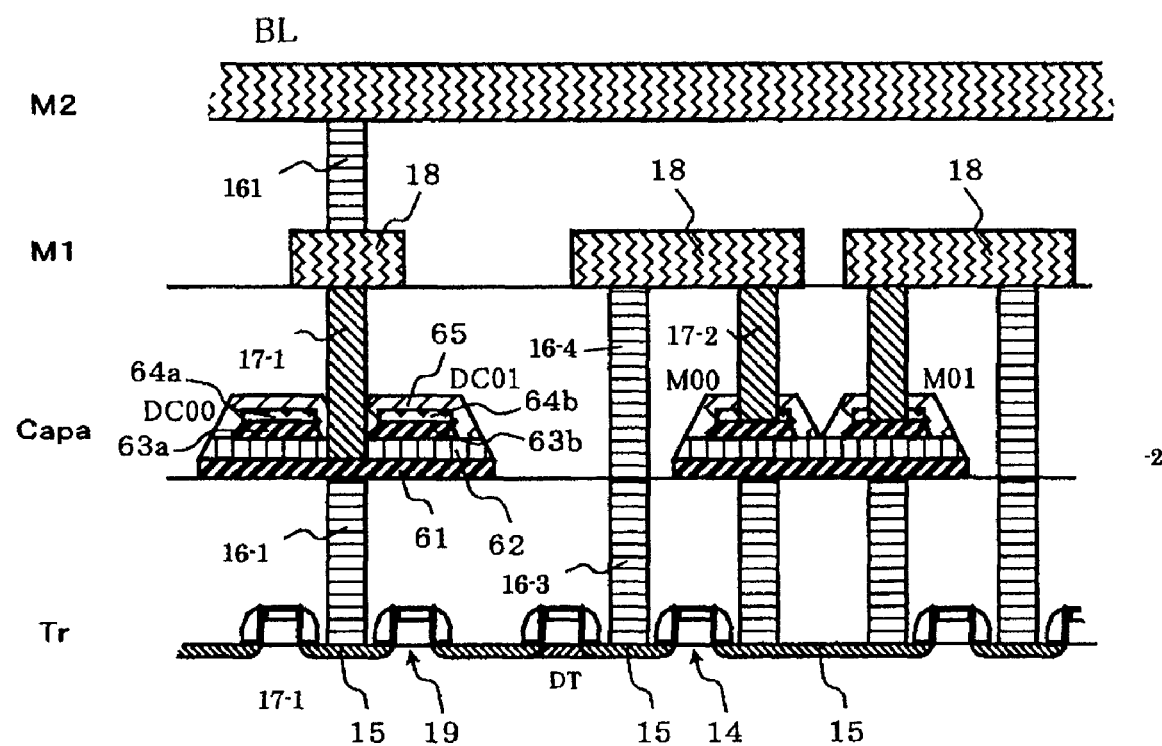
FIG. 7 is a schematic cross-section view showing a structure of a block selector portion and a memory block adjacent the block selector portion in the nonvolatile semiconductor memory device in the modification of the embodiment of the present invention.

FIG. 7 is a schematic cross-section view showing a structure of a block selector portion and a memory block adjacent the block selector portion in the nonvolatile semiconductor memory device in the modification of the embodiment of the present invention. Here, the structure including the dummy capacitors DC00, DC01 as shown in FIG. 6 is demonstrated in remaining the first mask and the second mask used as forming the ferroelectric capacitor. Further, a portion except the cell capacitors M00, M01, and the dummy capacitors DC00, DC01 is the same portion as shown in FIG. 1, therefore, explanation on the same number as FIGS. 4A-4B in the modification of the embodiment is omitted.

As shown in FIG. 7, in the dummy capacitors DC00, DC01 of the nonvolatile semiconductor memory device in the modification, the first W-plug 16-1 extended from the diffusion layer 15 of the selection Tr 19 is connected to the common lower electrode 61 and the Al-plug 17-1 extended from the isolated M1 wiring 18 connecting to the BL is embedded between the paired upper electrodes 63a, 63b and the second masks 64a, 64b. The Al-plug 17-1 also is embedded in the second mask 65 and the ferroelectric film 62 to connect to the lower electrode 61.

On the other hand, in the cell capacitors M00, M01 of the memory block 12, the first W-plugs 16-3, 16-4 extended from each M1 wiring 18 the diffusion layer 15 is connected to the diffusion layer 15 of the switching Tr 14, and the Al-plug 17-1 extended from each M1 wiring 18 is connected to each of the paired upper electrodes 63a and 63b. The Al-plug 17-1 is embedded in the first masks 64a, 64b, and the second mask 65 to connect to the upper electrodes 63a, 63b.

Namely, the inter-layer insulator, the masks 64, 65, and the ferroelectric film 62 are etched, subsequently a contact hole for forming the Al-plug 17-1 is etched by RIE having a function to stop the etching at the lower electrode 61 or the upper film 63. Consequently, the structure as shown in FIG. 7 is simultaneously formed.

According to the embodiment and the modification, the dummy capacitors DC00 and DC01 can provide hydrogen passivation effect to block hydrogen diffusion in the process with hydrogen such as forming the tungsten plug 161.

Furthermore, using the dummy capacitors DC00 and DC01 can solve the difficulty of connecting in the contact by lowering an aspect ratio at the Al plug 17-1, for example.

As the dummy capacitors DC00, DC01 can be disposed despite the configuration of the Al plug 17-1, micro loading effect in an etching process of the ferroelectric capacitor can be effectively suppressed so that a shape and characteristics of the cell capacitors M00-M07 in the end of the memory block can be improved.

Moreover, in the case of the modification, the hydrogen passivation effect can be up by remaining the mask.

According to the embodiment and modification, the Al-plug 17-1 in the block selector portion 13 is embedded between the two upper electrode of the dummy capacitor DC00, DC01 to be connected to the lower electrode, as a result, the Al-plug 17-1 in the block selector portion 13 can be formed the same process as Al-plug 17-2 being connected to the upper electrode of the cell capacitors M00-M07 in the memory block 12. Hence, micro loading effect in forming the ferroelectric capacitor can be effectively suppressed without increasing processing steps.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

Figure 8:
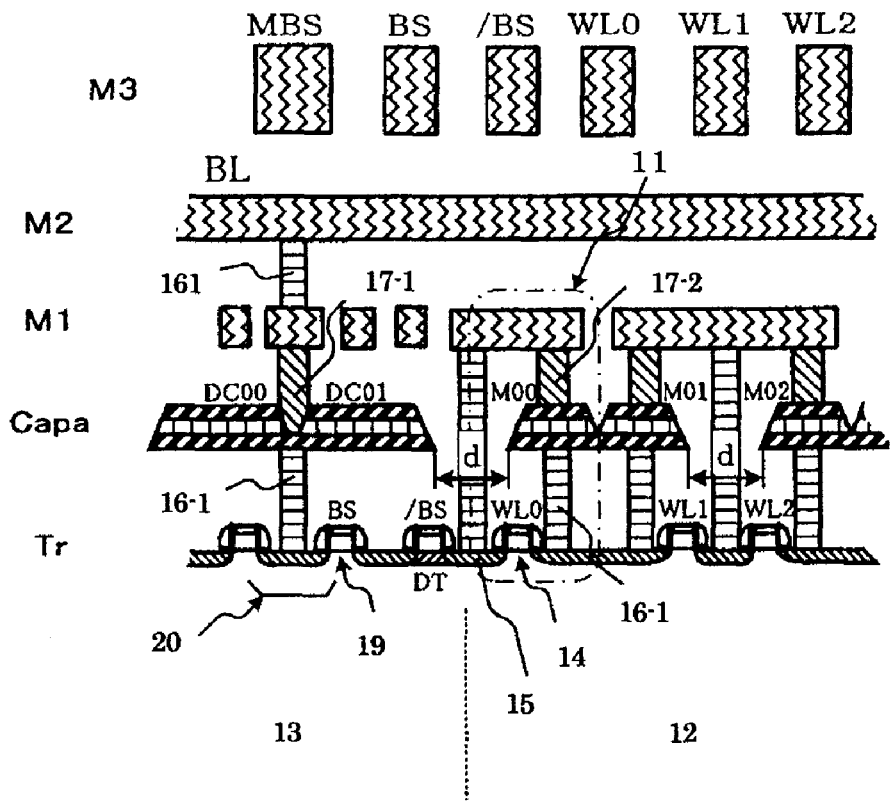
FIG. 8 is a schematic cross-section view showing an another structure of a block selector portion and a memory block adjacent the block selector portion in a nonvolatile semiconductor memory device in another modification of the embodiment in the present invention.

For example, in the embodiment and the modification, the size of the dummy capacitors DC00 and DC01 is the same as the size of the cell capacitors M00-M07, however, the present invention is not restricted in the above case. When the size has a capability to being disposed in the block selector portion 13, the size can be principally adapted. As shown in FIG. 8, a distance d between the paired cell capacitors M01, M02 in the memory block 12 is basically equal, respectively. Accordingly, a distance between the dummy capacitors DC00, DC01 and the adjacent cell capacitor M00 is set to be preferably equal at the distance d of the paired cell capacitors in the memory block 12 can further suppress the micro loading effect in the etching process of the ferroelectric capacitor so as to be able to lower a variation of the etching shape.

Figure 9:
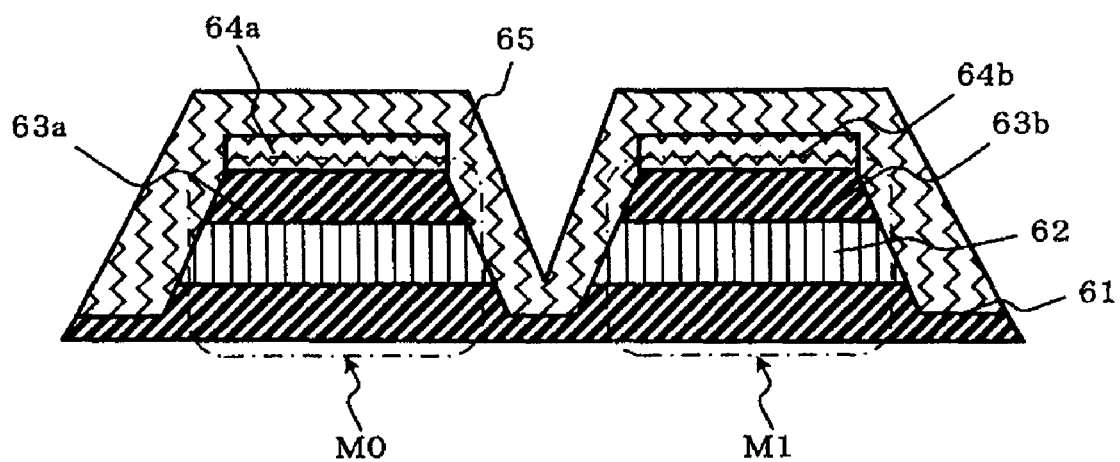
FIG. 9 is a schematic cross-section view showing another structure of a ferroelectric capacitor in the nonvolatile semiconductor memory device in another modification of the embodiment in the present invention.

Further, in the embodiment and the modification, when the ferroelectric capacitor is etched, the ferroelectric film FE is halfway etched by using the first mask 64a and the first mask 64b. However, the present invention is not restricted in the above case. For example, as shown in FIG. 9, the first mask 64a and the first mask 64b are halfway etched to the upper electrode TE, the ferroelectric film FE, and the bottom electrode film BE by using the masks 64a, 64b and the remaining bottom electrode film BE is etched by using the second mask.

Further, in the modification, the ferroelectric capacitor is etched by using two kinds of the masks. However, the present invention is not restricted in the above case. A structure as the same as the structure formed by the above case can be formed by one kind of the mask, as disclosed in Japanese Patent Publication (Kokai) No. 2001-257320.

Further, in the embodiment, the Al-plug 17-1 is used to connect between the M1 wiring and the dummy capacitors DC00, DC01 in the block selector portion 13. However, the present invention is not restricted in the above case. For example, the W-plugs in stead of the Al plug 17-1, 17-2 may be used in a range of the hydrogen process without influence on characteristics of the ferroelectric capacitor. In this case, the alternative W-plugs being called the W-plug 17-1 and the W-plug 17-2 in stead of the Al plug 17-1, 17-2 can be simultaneously formed in one deposition process. Furthermore, the W-plug 16-4 can be also formed in the same deposition process of the W-plug 17-1 and the W-plug 17-2. Moreover, the W-plug 16-3 and the W-plug 16-4 can be continuously formed by single processing step.

What is claimed is:

1. A semiconductor memory device comprising;
    a first transistor and a second transistor formed on a semiconductor substrate, both the first transistor and the second transistor being MIS transistors;
    a memory capacitor formed above the first transistor, the memory capacitor being connected to the first transistor, the memory capacitor being stacked with a lower electrode, a dielectric film and an upper electrode in order, the lower electrode being connected to a source or a drain of the first transistor;
    a pair of dummy memory capacitors formed above the second transistor, each dummy memory capacitor being stacked with a dummy lower electrode, a dummy dielectric film and a dummy upper electrode in order, the dummy lower electrodes in the pair being configured as a common electrode, the memory capacitor and the dummy memory capacitor being formed in a same plane above the semiconductor substrate;
    a wiring layer formed above the memory capacitor and the dummy memory capacitor, the wiring layer being connected to the source or the drain of the first transistor and the upper electrode;
    a first plug connecting between a source or a drain of the second transistor and the dummy lower electrode; and
    a second plug connecting between the dummy lower electrode and the wiring layer, the second plug penetrating into the paired dummy upper electrodes and the paired dummy dielectric films to contact with a surface of the dummy lower electrode.

2. The semiconductor memory device according to the claim 1, wherein
    a source or a drain of the second transistor is connected to a source or a drain of the first transistor via a dummy transistor.

3. The semiconductor memory device according to the claim 1, wherein both the dielectric film and the dummy dielectric film are ferroelectric film.

4. The semiconductor memory device according to the claim 1, further comprising:
    a first mask film on the paired dummy upper electrodes; and
    a second mask film on the first mask film, sidewalls of the paired dummy dielectric films and a portion of the dummy lower electrode between the paired dummy capacitors;
    wherein the second plug penetrates into the second mask film to contact with a surface of the portion of the dummy lower electrode.

5. The semiconductor memory device according to the claim 1, wherein
    a sidewall of the second plug is in contact with at least one of the sidewalls of the paired dummy upper electrodes and the paired dummy dielectric films.

* * * * *